(12) United States Patent
Hatzilambrou et al.

(10) Patent No.: US 6,801,416 B2
(45) Date of Patent: Oct. 5, 2004

(54) ESD PROTECTION SYSTEM FOR HIGH FREQUENCY APPLICATIONS

(75) Inventors: Mark Hatzilambrou, La Canada, CA (US); Chester Leung, Northfield (GB); Rajan Walia, Singapore (SG); Lien Wee Liang, Singapore (SG); Subhash C. Rustagi, Singapore (SG); M K Radhakrishnan, Singapore (SG)

(73) Assignee: Institute of Microelectronics, Singapore (SG)

( * ) Notice: Subject to any disclaimer, the term of this patent is extended or adjusted under 35 U.S.C. 154(b) by 308 days.

(21) Appl. No.: 09/938,040

(22) Filed: Aug. 23, 2001

(65) Prior Publication Data

US 2003/0039084 A1 Feb. 27, 2003

(51) Int. Cl.[7] ................................................. H02H 9/00
(52) U.S. Cl. ....................................................... 361/56
(58) Field of Search .................... 361/56, 111; 327/537, 327/530, 109, 436, 434

(56) References Cited

U.S. PATENT DOCUMENTS

| | | | | |
|---|---|---|---|---|
| 4,724,471 A | * | 2/1988 | Leuschner | 257/360 |
| 5,117,129 A | * | 5/1992 | Hoffman et al. | 307/443 |
| 5,255,146 A | * | 10/1993 | Miller | 361/56 |
| 5,287,241 A | | 2/1994 | Puar | 361/56 |
| 5,436,183 A | * | 7/1995 | Davis et al. | 437/40 |
| 5,508,649 A | | 4/1996 | Shay | 327/318 |
| 5,515,225 A | | 5/1996 | Gens et al. | 361/56 |
| 5,530,612 A | | 6/1996 | Maloney | 361/56 |
| 5,559,659 A | | 9/1996 | Strauss | 361/56 |
| 5,654,862 A | | 8/1997 | Worley et al. | 361/111 |
| 5,740,000 A | | 4/1998 | Stackhouse et al. | 361/56 |
| 5,744,842 A | * | 4/1998 | Ker | 257/362 |
| 5,745,323 A | | 4/1998 | English et al. | 361/56 |
| 5,907,464 A | | 5/1999 | Maloney et al. | 361/111 |
| 5,946,177 A | * | 8/1999 | Miller et al. | 361/56 |
| 5,986,861 A | | 11/1999 | Pontarollo | 361/56 |
| 5,991,135 A | * | 11/1999 | Saleh | 361/56 |
| 6,014,298 A | | 1/2000 | Yu | 361/56 |
| 6,072,682 A | | 6/2000 | Ravanelli et al. | 361/111 |
| 6,091,593 A | | 7/2000 | Lin | 361/111 |
| 6,385,028 B1 | * | 5/2002 | Kouno | 361/111 |
| 6,404,269 B1 | * | 6/2002 | Voldman | 327/534 |
| 6,510,033 B1 | * | 1/2003 | Maloney et al. | 361/111 |

OTHER PUBLICATIONS

Ker et al., ESD Protection Design on Analog Pin with Very Low INput Capacitance for High–Frequency or Current Mode Applications. IEEE Journal of Solid–State Circuits, vol. 35, No. 8, Aug. 2000.*

* cited by examiner

Primary Examiner—Gregory J Toatley, Jr.
Assistant Examiner—Z Kitov
(74) Attorney, Agent, or Firm—George O. Saile; Stephen B. Ackerman

(57) ABSTRACT

Electrostatic discharge (ESD) protection for circuits which utilize multiple power supply rails, both positive (Vdd) and negative (Vss). Vdd busses remain completely isolated, while Vss busses are joined by pairs of complementary polarity diodes (made typically with P+/N-well diodes in an N/P-substrate process) thus keeping Vss busses isolated from each other. The I/O diodes of high frequency I/O pads are arranged in a square layout to achieve the best current/capacitance ratio. Each pair of power rails is provided with its own power shunt circuit, placing each shunt in physical proximity to the I/O pad it must protect. Shunts are designed to clamp at a very low voltage during an ESD event using mostly PMOS transistors. The protection circuit is laid out such that the worst case ESD event will flow at most between two I/O pads and one power shunt.

33 Claims, 5 Drawing Sheets

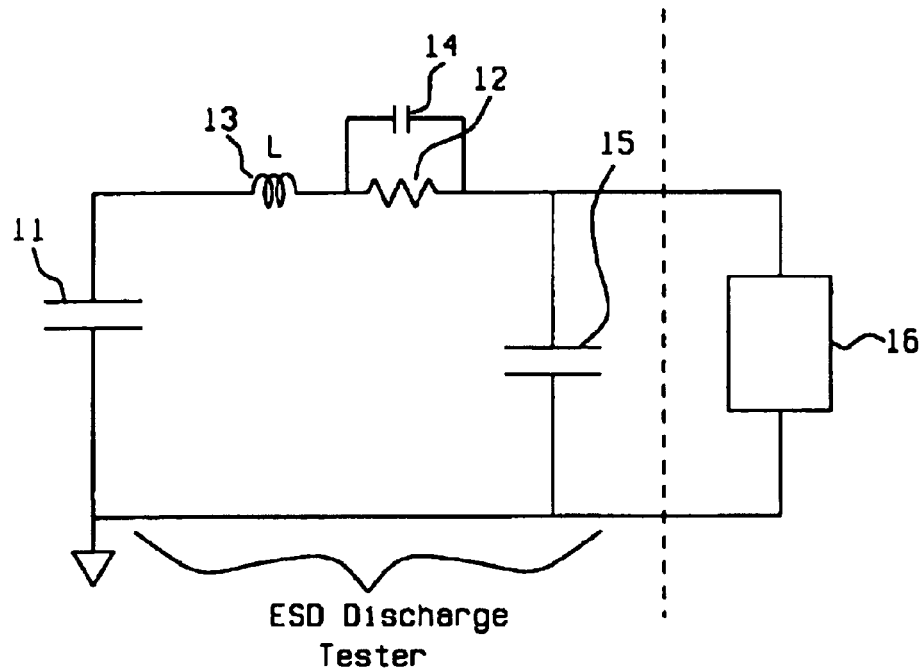
*FIG. 1 – Prior Art*
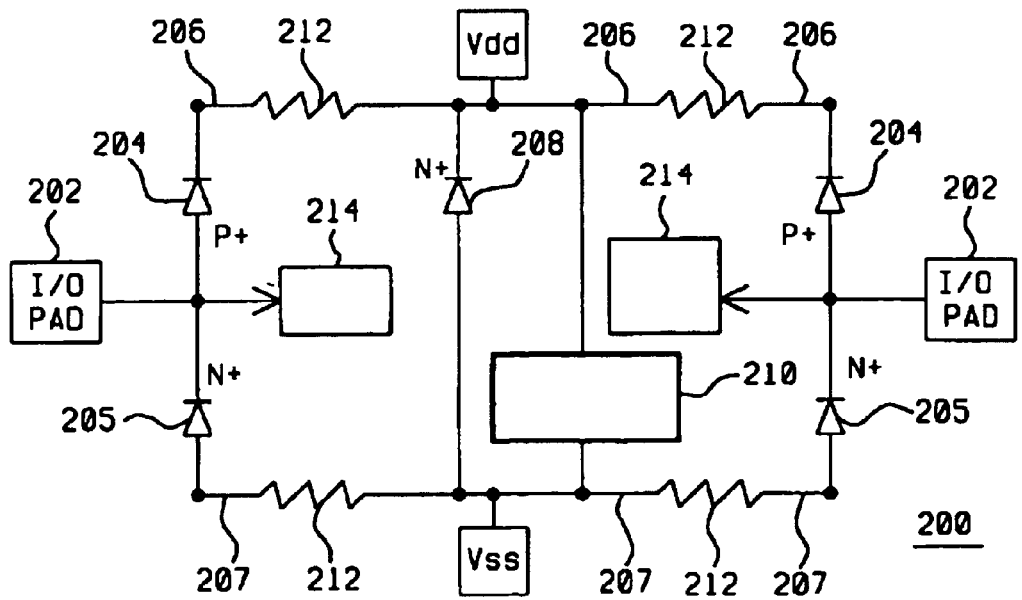
*FIG. 2 – Prior Art*

ESD PROTECTION SYSTEM FOR HIGH FREQUENCY APPLICATIONS

BACKGROUND OF THE INVENTION

1. Field of the Invention

The invention relates to electrostatic discharge (ESD) protection circuits, and more particularly to ESD circuits for multiple power supplies in radio frequency (RF) applications.

2. Description of the Related Art

Integrated circuits, especially silicon integrated circuits (IC), are susceptible to damage caused by electrostatic discharge from environmental sources. Such sources of relative charge are human beings handling the wafer, die, or packaged IC, improperly grounded test and assembly equipment, and the device itself, which may accumulate charge during storage and transport. To avoid these post-fabrication yield losses, each IC must be designed to withstand the likely types of environmental electrostatic discharge it may face. The basic models used are the Human Body Model (HBM) as per FIG. 1, Machine Model (MM), and the Charged Device Model (CDM).

In FIG. 1 a schematic for a Human Body Model (HBM) type ESD discharge tester is shown to the left of the dotted line. The 100 pF capacitor 11 and the 1.5 kOhm resistor 12 are essential to the model. The inductance 13 and other capacitances 14 and 15 are parasitic elements of the tester. The Device Under Test (DUT) 16 is shown to the right of the dotted line. In evaluation of the proposed ESD protection system, the inventors used the HBM in all of their testing.

Special devices are placed in the layout of the IC to steer the discharge current away from the functional IC circuitry. The scheme we have used in our implementation is based upon the prior art dual-diode and shunt scheme 200 shown in FIG. 2. The diodes 204, 205 connecting the I/O pads 202 to the power supply rails 206, 207 (and the Vss to Vdd diode 208) along with the power shunt 210, which connects the power supply rails in the case of a positively ramped voltage from Vdd to Vss, provide a low impedance path for current flow between any two pins when the IC is powered down. For example, a positive spike from an I/O pad to Vss will cause current to run through a P+/N-well diode 204 and then down through the power shunt circuit 210. The I/O circuits and core 214 receive their input directly from the I/O pads. The resistances 212 shown in the power supply rails are parasitic resistances that lead to voltage drops during the current pulse.

For the system to work properly, each current steering element (the diodes and the shunt) must drop as little voltage for as high a current as possible. Moreover, the parasitic metal resistances must be accounted for and understood. Therefore, the shunts and diodes must be well designed to be as efficient as possible.

RF circuits have an additional constraint that the diodes 204, 205 on the input pads 202 must present very little capacitive loading to the signal compared with the amount that lower frequency parts can tolerate. In addition, this capacitance should preferably be bias-independent. The low-loading requirement dictates that the diodes must be scaled down, thus raising the voltage drop for a given ESD current. To compensate for this, the power shunt circuit must be designed to be very robust to allow for the greater drop from the I/O pad diodes 204, 205.

The diode-coupling and shunt scheme proposed by the inventors contrasts with those by Stackhouse et al. (U.S. Pat. No. 5,740,000), Worley et al. (U.S. Pat. No. 5,654,862), Maloney (U.S. Pat. No. 5,530,612), and Gens et al. (U.S. Pat. No. 5,515,225). The difference is that all of these use a single main shunt between two power supply nodes and couple other power supplies (including the Vdd supplies) via diodes or bridge circuits.

The clamp of the power shunt circuit differs from the one used by Stackhouse, et al. (U.S. Pat. No. 5,740,000) in the implementation of the RC timer. Prior art power shunt circuits are also shown by Miller et al. (U.S. Pat. No. 5,946,177) and Shay (U.S. Pat. No. 5,508,649) but differ in the implementation.

The proposed three-inversion RC-timed shunt for the power shunt circuit is superior to the one used by Ker (U.S. Pat. No. 5,744,842) and Strauss (U.S. Pat. No. 5,559,659) because of the advantage which PMOS devices provide and which will be shown in the body of the proposed invention.

Other U.S. Patents not already mentioned, but relating to the present invention, are:

U.S. Pat. No. 6,091,593 (Lin) discloses an RC timed ring-oscillator charge pump for inducing turn-on in MOS or bipolar protection devices.

U.S. Pat. No. 6,072,682 (Ravanelli et al.) describes an all NMOS RC-triggered source-follower shunt.

U.S. Pat. No. 6,014,298 (Yu) discloses an RC timed switch to be placed in series between power Vcc and circuit to be protected. The switch turns off when an ESD is detected to prevent discharge going through the core circuit.

U.S. Pat. No. 5,986,861 (Pontarollo) presents a simple clamp, with a PMOS final transistor and NMOS inverter triggered by RC.

U.S. Pat. No. 5,907,464 (Maloney et al.) describes a shunt circuit with a PMOS final driver and timed by a PMOS resistor/generic capacitor time constant.

U.S. Pat. No. 5,745,323 (English et al.) teaches an input line protection circuit which uses RC-timed PMOS and NMOS transistors to discharge ESD current to the Vdd and Vss power rails.

U.S. Pat. No. 5,287,241 (Puar) discloses a PMOS final driver triggered and timed by a PMOS resistor/NMOS capacitor RC.

U.S. Pat. No. 5,255,146 (Miller) describes an NMOS final driver with three RC timers, feedback loop, and NAND gate triggering to detect the rise time of the ESD, to insure that the ESD is longer than a typical noise pulse.

SUMMARY OF THE INVENTION

It is an object of the present invention to steer ESD currents away from the functional IC circuitry and thus protect this circuitry when an ESD is applied between any two pads of the IC in any direction, in particular with respect to RF IC circuitry.

It is another object of the present invention to provide this protection from ESD currents to circuits which utilize multiple power supply rails for both the more positive, Vdd, and the more negative, Vss, power supply rail.

It is yet another object of the present invention to provide complete isolation of the Vdd busses so that noise on one Vdd bus does not directly couple to another Vdd bus.

It is still another object of the present invention to provide this isolation with low capacitive loading for radio frequency (RF) systems.

It is a further object of the present invention to allow operation of the various Vdd busses at any supply voltage required for circuit operation.

It is yet a further object of the present invention to provide operation in which the various Vss busses may differ in potential by up to a single diode drop.

It is still a further object of the present invention to provide operation in which the various Vss busses are at the same potential and are joined together through the resistive substrate.

These and many other objects have been achieved by:

connecting together Vss busses by a pair of complementary polarity diodes made typically with P+/N-well diodes in an N/P-substrate process;

paying special attention to the I/O diodes of high frequency I/O pads, such that no resistance is in the signal path, and that the capacitance per diode is kept to less than 200 femto-Farads ($200 \times 10^{-15}$ F);

special diode layout to insure that the highest current capacity per femto-Farad of loading capacitance is achieved;

insuring that the worst case ESD event will flow at most between two I/O pads and one power shunt;

insuring that the power shunt circuit clamps are at a very low voltage during an ESD event;

providing each pair of power rails its own shunt circuit thus placing each shunt in physical proximity to the I/O pad it must protect; and providing an I/O diode layout with the largest perimeter/area ratio possible.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a schematic diagram of the Human Body Model (HBM) type ESD discharge tester.

FIG. 2 is a circuit diagram of a dual-diode and power rails shunt for a single pair of power rails and multiple I/O pads of the prior art.

DESCRIPTION OF THE PREFERRED EMBODIMENT

Figure 3:
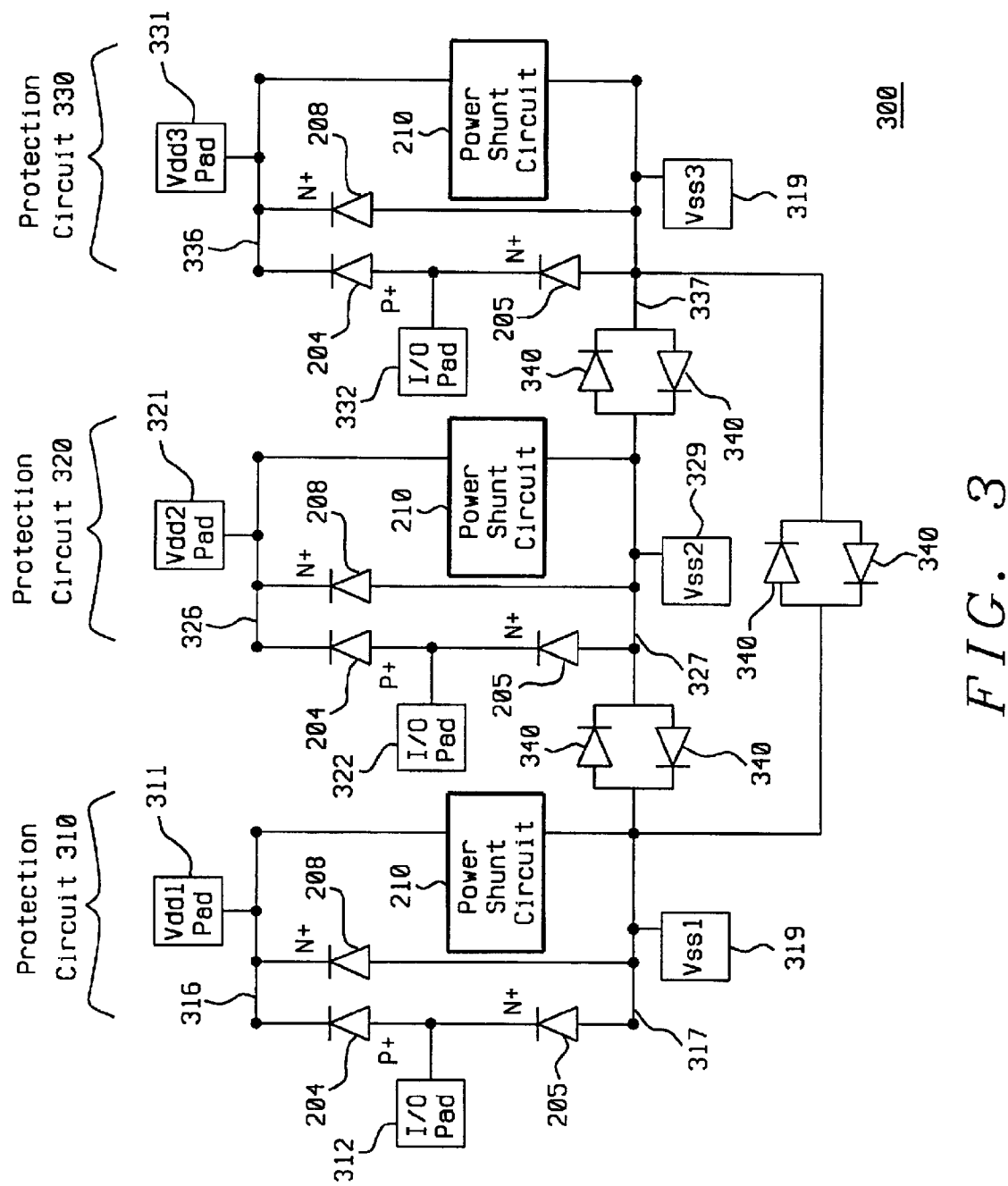
FIG. 3 is a high level circuit diagram of a general RF ESD protection scheme of the present invention.

The general layout of the radio frequency (RF) electrostatic discharge (ESD) protection invention 300 is shown in FIG. 3. Multiple I/O pads for each power supply rail pair are assumed, although only one is shown for each power supply rail pair in FIG. 3. The same numerals in FIG. 2 and FIG. 3 designate the same component.

In this invention, multiple power supply rail pairs are connected together through the various Vss busses only, which are connected together by a pair of complementary polarity diodes 340, also called Vss coupling diodes. The Vdd busses 316, 326, 336 remain completely isolated so that noise on one Vdd bus does not directly couple to another Vdd bus. This is important for RF systems in which various circuit blocks must be well isolated from one another. Also notice in this system that the various Vdd busses 316, 326, 336 may operate at any supply voltages required for circuit operation.

This invention is applicable for systems in which the various Vss bus voltages do not differ by more than a single diode drop. In most cases, all Vss busses will be at the same potential and will often be connected together through the resistive substrate, and they may be isolated solely to further limit supply noise cross talk. In the case that the various Vss busses are shorted together by metal, i.e. there is just a single common Vss node, the system works just as well for ESD (even better, actually) while allowing the Vdd busses to remain separate. Inspection of the system reveals that an ESD current pulse between any two I/O pads 312, 322, 332 in any direction will result in at most a three diode and one power shunt voltage drop, plus parasitic voltage drops due to resistance in the routing (not shown). Similarly, an ESD event between an I/O pad and Vdd or Vss equals a two diode and one power shunt voltage drop. While FIG. 3 illustrates three separate systems 310, 320, and 330 it is well understood that this number can vary to suit the particular design.

The Vss coupling diodes 340 are typically made with P+/N-well diodes in an N-well/P-substrate process. N+/P-substrate diodes may be used if the Vss busses to be connected are tied to the substrate. In this case, pseudo-isolation of the various Vss busses simply requires that any P+ substrate taps remain far enough apart to provide resistive isolation through the substrate.

The diodes on any high frequency I/O pads, such as the RF signal pads, require special attention. In addition to the requirement that no resistance may be in the signal path, capacitance must be managed and typically kept very low, typically less than 200 fF (fF=femto Farad=$10^{-15}$ Farad) per diode to prevent signal loss through the ESD diodes during circuit operation. Special diode layout must be used to insure that the highest current carrying capacity possible per femto-Farad of loading capacitance is achieved. Nevertheless, scaling the capacitance down inevitably causes current carrying capability to drop, which implies a larger voltage drop across the diode for a given ESD current. Because the worst case ESD event will flow between two I/O pads 12 and the power shunt 210, the power shunt must be designed to clamp at a very low voltage during an ESD event.

A further aspect of the system is that each pair of power supply rails 316/317, 326/327, 336/337 needs its own power shunt circuit 210 to conduct current for a positive pulse from Vdd to Vss. The drawback of this is that it will of course consume more silicon area than an optimal ESD system for non-Vdd-isolated systems. But the advantage of this separated shunt system is that it places each shunt in physical proximity to the I/O pads (e.g., 312, 322, 332) it must protect. Because most circuit components are connected to a single pair of power supply rails only, the voltage drop of consequence is the total across the single pair of power supply rails at issue. Thus, the consequences of the ESD pulse are divided and conquered by this system. Special attention needs to be paid only to the interface devices where power bus resistances will have the largest impact.

We now describe the circuit of FIG. 3 in greater detail. The general RF ESD protection circuit 300 comprises three protection circuits 310, 320, and 330. The number of protection circuits shown is for illustration purposes only and could be more or less than three. Each power supply rail is connected to a pair of power pads Vdd1/Vss1 (311/319), Vdd2/Vss2 (321/329), Vdd3/Vss3 (331/339). Coupled between the power rails of each protection circuit are first and second I/O diodes 204 and 205. I/O pads 312, 322, 332, the inputs to the protection circuits, are coupled to the junction of these I/O diodes. In one preferred embodiment of the present invention the power rails Vss1, Vss2, and Vss3 are connected directly to each other. In a second preferred embodiment these power rails are coupled together via complementary polarity diodes 340. In the example of FIG. 3, three sets of these complementary polarity diodes are required. The number of complementary polarity diodes is determined by the combinatorial function, e.g. four protection circuits require 6 sets of complementary polarity diodes.

Power Shunt Circuit

Figure 4:
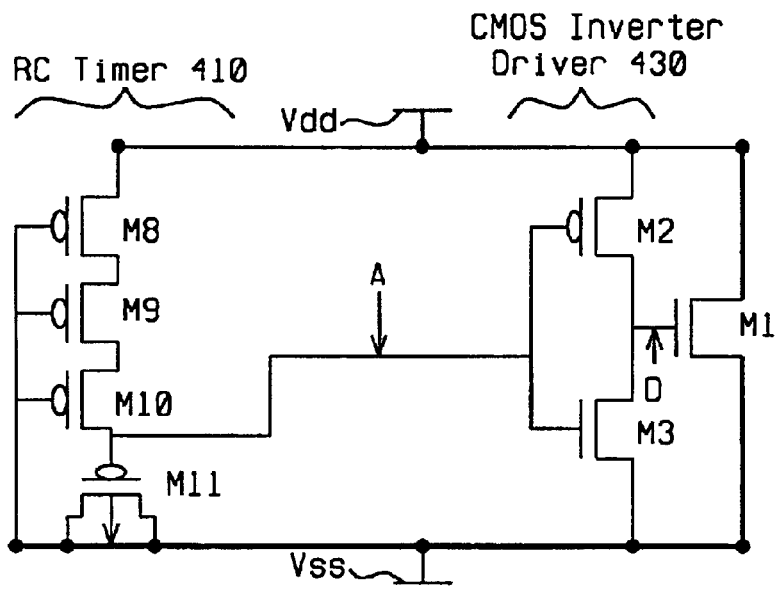
FIG. 4 is a circuit diagram of a simple power shunt circuit according to a first preferred embodiment of the present invention.
Figure 5:
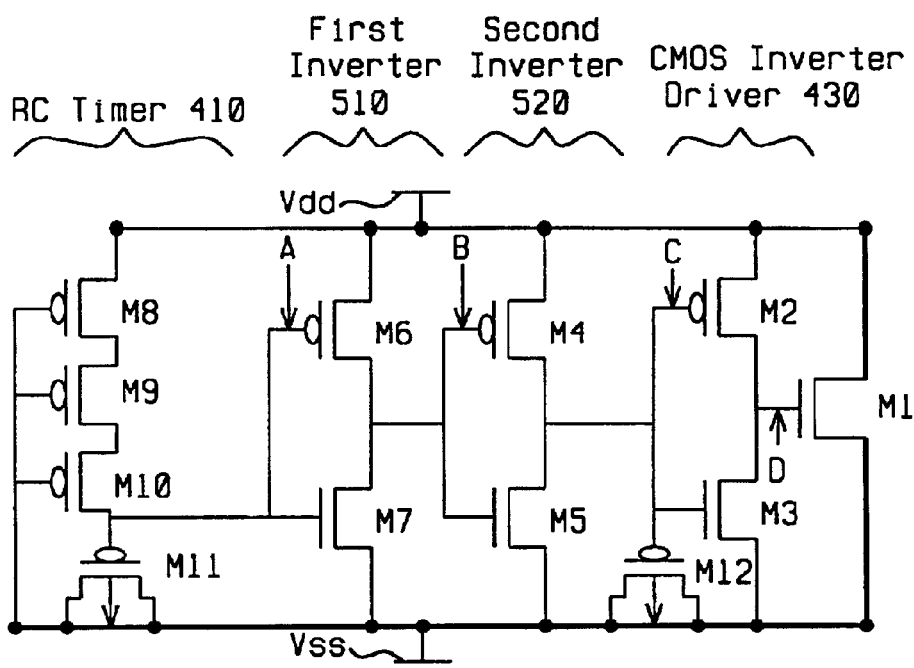
FIG. 5 is a circuit diagram of a more complex power shunt circuit having a lower clamping voltage than the circuit of FIG. 4 according to a second preferred embodiment of the present invention.

The circuits of FIG. 4 and FIG. 5 are transient-type, designed to turn on when the voltage ramp on Vdd is faster than an RC time-constant and greater than PMOS Vt. When no power is applied to the circuit (as is the case when most ESD damage occurs), all nodes are at the same potential. From FIG. 4, we see that when a positive voltage spike occurs at Vdd, node A is held low by PMOS capacitor M11. This voltage difference turns on device M2 which allows node D to follow Vdd. Thus, M1 is diode-connected to Vdd and clamps Vdd until node A charges through devices, M8–M10. The CMOS inverter driver 430, formed by devices M2 and M3, has a trip point skewed high to speed the turn-on of device M1. The same numerals in FIG. 4 and FIG. 5 designate the same component.

We now describe the circuit of FIG. 4 in greater detail. Power shunt circuit 210 comprises RC timer 410 and CMOS inverter driver 430. The RC timer is coupled between Vdd, the first power supply rail, and Vss, the second power supply rail. The RC timer comprises PMOS transistors M8, M9, and M10 (the first, second and third PMOS transistor) all connected in series, where the source of M8 is coupled to Vdd. The gates of M8, M9, and M10 are coupled to Vss. The drain of M10 is coupled to node A and to the gate of PMOS transistor M11 (the fourth PMOS transistor). The source and drain of M11 are coupled to Vss. The gates of PMOS transistors M2 (the fifth PMOS transistor) and M3 (the first NMOS transistor) are coupled to node A. The junction of M2 and M3 forms node D which is coupled to the gate of output NMOS transistor M1 (the second NMOS transistor). The width ratio of M2 to M3 is typically 4:1. The output transistor M1 has a typical width/length dimension of 2000/0.35 micron. The numbers next to each transistor give the preferred width and length of the transistor. However, these dimensions can vary to suit the specific design.

FIG. 5 shows the enhanced version of this type of clamp. It is designed to clamp Vdd to a lower voltage through the much larger M1 transistor. The width of transistor M1 is now reduced to typically 6000 $\mu$m ($\mu$m=micron). The clamp of FIG. 5 also has two further inverter stages 510, 520 (devices M6, M7 and M4, M5, respectively) and a further capacitor M12 to enhance the turn-on speed. The RC timer 410 is identical to that in FIG. 4. Device M2 of CMOS inverter driver 430 is made larger to provide necessary drive to the larger M1 device during turn-on. Device M12 holds node C low when a spike occurs at Vdd so that the bootstrap effect of the drain-to-gate capacitance of M2 is diminished. Thus, capacitive voltage division between M2 and M12 initiates turn-on. The inverter 520 formed by M4 and M5 is also skewed to preferentially keep node C low during an ESD event. The inverter 510 formed by M6 and M7, however, has a normal mid-swing trip-point so that during normal operation, noise at Vdd will not turn the shunt on for longer than the RC time-constant formed by resistance M4 and the capacitance at node C.

We now describe the circuit of FIG. 5 in greater detail. In the second preferred embodiment of the present invention the power shunt circuit 210 of FIG. 4 is enhanced to clamp Vdd to a lower voltage as already stated earlier. First inverter 510 is coupled between Vdd (first power supply rail) and Vss (second power supply rail) and its input connects to node A. Its output is node B which is also the junction of M6 and M7. Second inverter 520 is similarly coupled between Vdd and Vss and its input connects to node B. Its output is node C which is also the junction of M4 and M5. A sixth PMOS transistor M12 is wired as a capacitor by coupling the drain and source to Vss. The gate of M12 is connected to node C. The gates of PMOS transistors M2 (the fifth PMOS transistor) and M3 (the first NMOS transistor) are also coupled to node C. Note that the width of M2 in FIG. 5 was increased to 800 $\mu$m from 400 $\mu$m in the embodiment of FIG. 4.

Referring to both FIG. 4 and FIG. 5, the RC timer 410 itself is made exclusively from PMOS devices M8, M9, M10, and M11. Devices M8–M10 provide a large resistance in a small area. PMOS devices M11 and M12 are used rather than NMOS devices because they are operated in the accumulation region and provide a large capacitance through the full range of operation. An NMOS device used in a similar position presents a lower capacitance from 0V to Vt and is thus more easily bootstrapped up to Vt.

I/O Diodes

The diodes, such as 204, 205 of FIG. 3, used on the I/O pads 312, 322, 332 must provide the highest current carrying capacity per unit of capacitance possible. The preferred embodiment of the diode layout is shown in FIG. 6.

Figure 6:
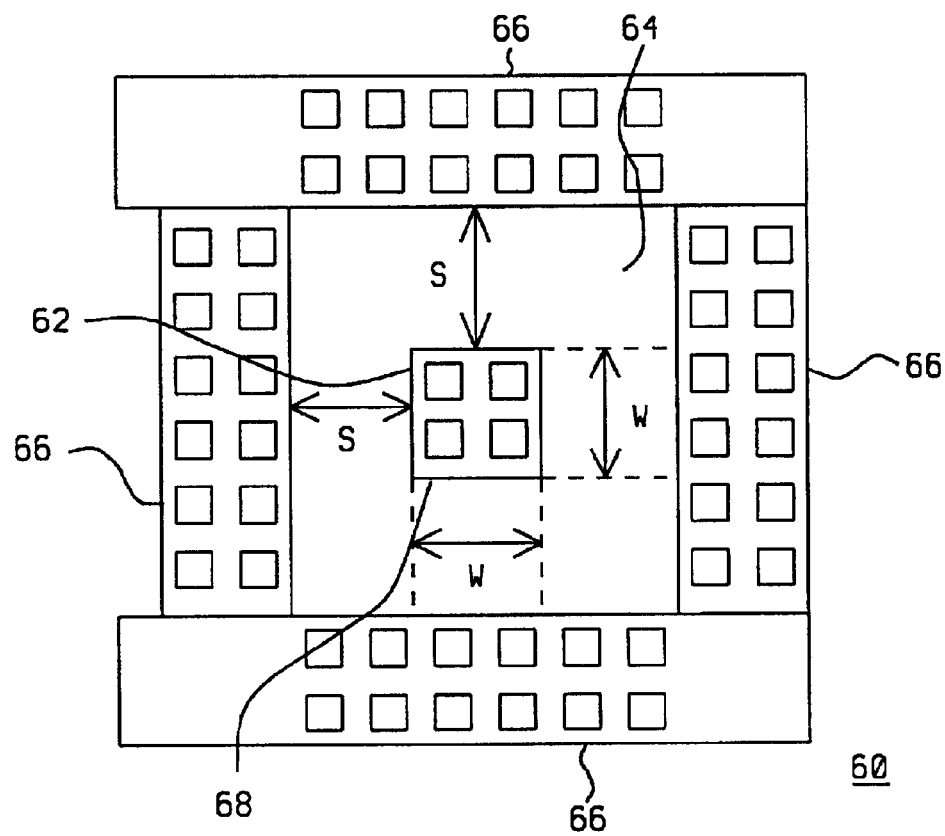
FIG. 6 is a top view of the layout used for an I/O diode of the present invention.
Figure 7:
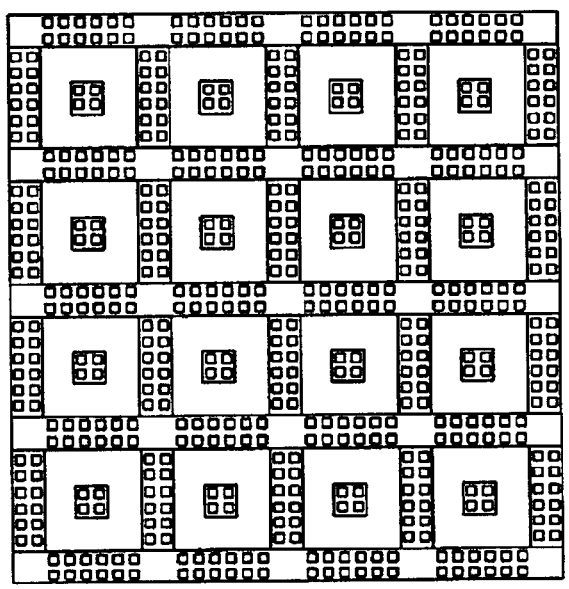
FIG. 7 is a top view of a plurality of I/O diodes of FIG. 6, scaled up by arraying the basic layout.

Still referring to FIG. 6, the layout 60 shown is of an N+/P-substrate diode 205 (second I/O diode) for connection between I/O pad (e.g. 312) and Vss. The P+/N-well diode 204 (first I/O diode) is identical but having complementary diffusions. The central square 62 is an N+ diffusion, which forms the diode junction with the substrate. The surrounding ring 64, of width S, is the p-base (or n-base for complimentary diodes). The width S between the diffusions 62 and 66 is set to minimum to provide lowest resistance. The N+ diffusion is square to provide the largest Perimeter/Area ratio, which is shown to provide the best current/capacitance ratio. The length W of each side of the square is set by the number of contacts 68 needed to pass the target current. Four contacts 68 are shown by way of illustration. The actual number used depends on the application. This diode layout is different than the standard finger-type layout that uses long, rectangular, minimum width diffusions rather than squares. While a square configuration of layout 60 is the preferred embodiment for the above stated reasons, other shapes such as, but not limited to, a rectangular configuration are possible. FIG. 7 is a layout which shows how ESD protection and capacitance can be scaled by arraying the basic layout of FIG. 6. FIG. 7 depicts a 4 by 4 array by way of example. It is obvious to those skilled in the art that any other dimensioned square or rectangular array is equally feasible.

The first I/O diode 204 is coupled between I/O pad (e.g. 312) and Vdd such that the anode connects to the I/O pad and the cathode to Vdd. The anode and the cathode correspond to the P+ diffusion and the N-well, respectively. The P+ diffusion relates to the central square 62 of FIG. 6, and the N-well base of width S relates to the surrounding ring 64. Because both diodes 204 and 205 direct current in the same direction, the anode of the second I/O diode 205 connects to Vss and the cathode to the I/O pad. The cathode and anode of I/O diode 205 correspond to the N+ diffusion and P-substrate, respectively.

Figure 8:
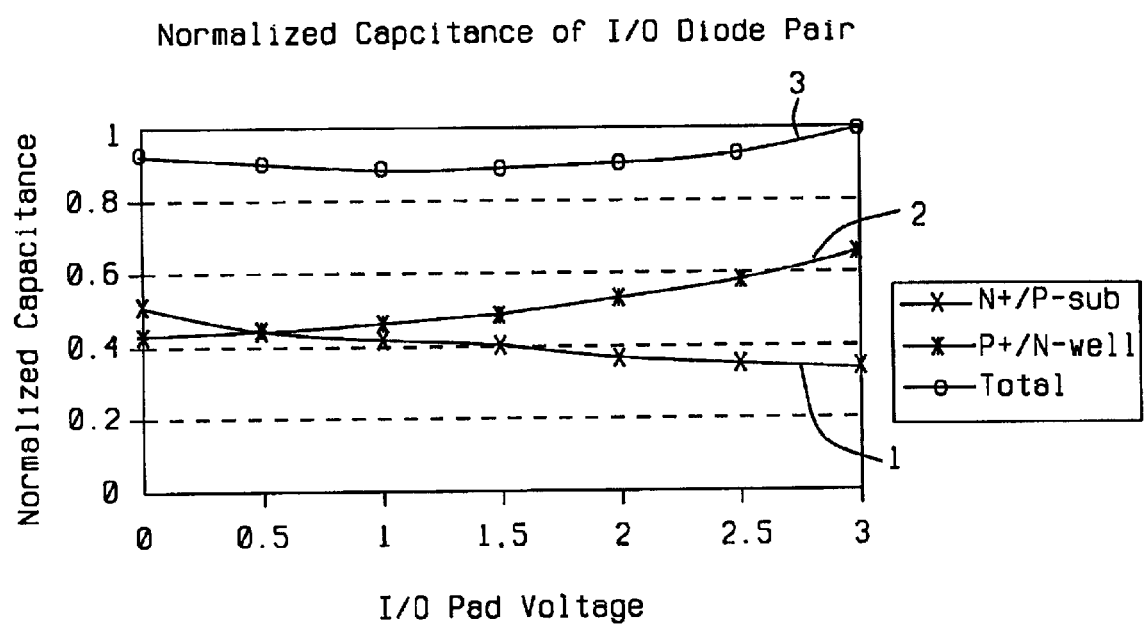
FIG. 8 is a graph illustrating the I/O diode pair capacitance vs. pad bias.

Another advantage of the I/O dual-diode invention is that the capacitance at the input node such as 312 is relatively bias independent. FIG. 8 shows this relationship. Curve 1 shows the capacitance vs. I/O pad bias for the P+/N-well diode, e.g. 204, Curve 2 shows the capacitance vs. I/O pad bias for the N+/P-substrate diode, e.g. 205, and Curve 3, the sum of the Curve 1 and 2, graphs the response of the diode pair. This is a characteristic of the dual-diode invention itself, rather than the square layout per se. Other layout geometry of the dual-diodes would also exhibit a similar characteristic.

While the invention has been particularly shown and described with reference to the preferred embodiments thereof, it will be understood by those skilled in the art that various changes in form and details may be made without departing from the spirit and scope of the invention.

What is claimed is:

1. A radio frequency (RF) electrostatic discharge (ESD) protection circuit for integrated circuits (IC) with a plurality of power supplies, comprising:
    on a substrate, a dual-mode shunt system providing a low impedance path for ESD, said dual-mode shunt system further comprising
        a pair of power supply rails consisting of a first and a second power supply rail;
        a power supply in communication with said first and said second power supply rail;
        a transient-type power shunt circuit in communication with said first and said second power supply rail, said power shunt circuit comprising at least an RC timer circuit and a CMOS inverter driver, said power shunt circuit providing a low impedance path for an ESD between said first and said second power supply rail, said power shunt circuit designed to turn on when the voltage ramp on said first power supply rail is faster than a RC time-constant, intrinsic to said power shunt circuit, and larger than the threshold voltage (Vt) of a PMOS transistor;
        a dual-diode scheme, comprising a serially coupled first and second I/O diode, formed in-between said first and said second power supply rail, the junction of said first and said second I/O diode coupled to an I/O pad, said first and said second I/O diode providing a conductive path for said ESD, said dual diode scheme ensuring that the capacitance at said I/O pad is bias independent for RF signal inputs, where the cathode of said first I/O diode is coupled to said first power supply, and the anode of said first I/O diode is coupled to said I/O pad, said first I/O diode arranged as a P+ diffusion/N-well diode thusly;
        where the anode and the cathode of said first I/O diode correspond to said P+ diffusion and said N-well, respectively;
        where said P+ diffusion of said first I/O diode is arranged in a rectangular shape, the area of said rectangular shape determined by the number of contacts needed to pass a target current;
        where said P+ diffusion further comprises an array of said contacts;
        where an N-well tap surrounds said P+ diffusion on all four sides at a distance S;
        where contacts of said N-well tap are arranged on each side of said N-well tap in one or more rows; and
    a plurality of said dual-mode shunt systems, each supplied by its own power supply operable at any supply voltage, said plurality of said dual-mode shunt systems all coupled together via said second power supply rail, said plurality of said dual-mode shunt systems capable of operating at any voltage of said power supplies, said first power supplies isolated from each other.

2. The circuit of claim 1, wherein said plurality of said dual-mode shunt systems is coupled together via said second power supply rails, each of said second power supply rails coupled to another second power supply rail by means of a set of complementary polarity diodes, said complementary polarity diodes isolating said plurality of second power supply rails from each other, to limit power supply noise cross talk.

3. The circuit of claim 2, wherein the voltage between any of said plurality of second power supplies does not differ by more than one diode drop.

4. The circuit of claim 1, wherein each pair of said power supply rails is provided with one of said power shunt circuits.

5. The circuit of claim 1, wherein said complementary polarity diodes are P+/N-well diodes made in an N-well/P-substrate process.

6. The circuit of claim 5, wherein said complementary polarity diodes are N+/P-substrate diodes when said second power supply rail is coupled to said substrate of said IC.

7. The circuit of claim 1, wherein additional I/O pads are coupled via additional first and second I/O diodes to said first and said second power supply rail.

8. The circuit of claim 1, wherein said power shunt circuit, in one preferred embodiment, comprises:
    said RC timer circuit, to provide said RC time-constant, further comprising:
        a first, a second, and a third PMOS transistor coupled in series, the source of said first PMOS transistor coupled to said first power supply rail, the drain of said third PMOS transistor coupled to a node A, the gates of said first, said second, and said third PMOS transistor coupled to said second power supply rail, said first, said second, and said third PMOS transistor acting as a resistive means, thereby creating a large resistance in a small area;
        a fourth PMOS transistor having its source and drain coupled to said second power supply rail and having its gate coupled to said node A, said fourth PMOS transistor wired to function as a capacitive means, said resistive means together with said fourth PMOS transistor acting as said RC time-constant;
    said CMOS inverter driver, formed by a fifth PMOS transistor and a first NMOS transistor coupled in series, such that the source of said fifth PMOS transistor is coupled to said first power supply rail and the source of said first NMOS transistor is coupled to said second power supply rail, the junction of said fifth PMOS transistor and said first NMOS transistor coupled to a node D, and the gate of said fifth PMOS transistor and said first NMOS transistor coupled to said node A, said CMOS inverter driver providing drive current; and
    a second NMOS transistor, its drain and source coupled between said first and said second power supply rail, respectively, and the gate of said second NMOS transistor coupled to said node D, said second NMOS transistor shunting an ESD from said first power supply rail to said second power supply rail.

9. The circuit of claim 8, wherein said CMOS inverter driver has its trip point skewed high to speed the turn-on of said first NMOS transistor by selecting a width ratio between said fifth PMOS transistor and said first NMOS transistor of about 4:1, respectively.

10. The circuit of claim 8, wherein said second NMOS transistor has a width/length dimension of about 2000/0.35 microns, respectively.

11. The circuit of claim 8, wherein said fourth PMOS transistor by operating in the accumulation region provides a large capacitance in the range from 0 Volt to the threshold voltage Vt.

12. The circuit of claim 8, wherein said power shunt circuit, in another preferred embodiment, further comprises:
a first inverter coupled between said first and said second power supply rail, said first inverter improving the turn-on speed of said power shunt circuit, the input of said first inverter coupled to said node A, the output of said first inverter labeled node B, said first inverter providing a normal mid-swing point;
a second inverter coupled between said first and said second power supply rail, said second inverter improving the turn-on speed of said power shunt circuit, the input of said second inverter coupled to said node B, the output of said second inverter labeled node C, the input response of said second inverter skewed to preferentially keep said node C low during an ESD event;
a sixth PMOS transistor having its source and drain coupled to said second power supply rail and having its gate coupled to said node C, said sixth PMOS transistor thus wired to function as a capacitive means, said sixth PMOS transistor together with said fifth PMOS transistor acting as a capacitive voltage divider;
said gate of said CMOS inverter driver coupled to said node C; and
an increase in the width of said second NMOS transistor to about 6000 micron, said second NMOS transistor thereby clamping said first rail to a much lower voltage.

13. The circuit of claim 12, wherein said sixth PMOS transistor by operating in the accumulation region provides a large capacitance in the range from 0 Volt to the threshold voltage Vt.

14. The circuit of claim 12, wherein said mid-swing point of said first inverter insures when no ESD event is present, that noise on said first power supply rail will not turn on said power shunt circuit for longer than an RC time-constant formed by a resistive component of said second inverter and the total capacitance at node C.

15. The circuit of claim 12, wherein said sixth PMOS transistor, acting as a capacitive means, holds low node C when a voltage spike occurs at said first power supply rail, thus diminishing a bootstrap effect caused by a drain-to-gate capacitance of said fifth PMOS transistor.

16. The circuit of claim 1, wherein a dimension S is set to a minimum to produce the lowest parasitic resistance in said N-well taps.

17. The circuit of claim 1, wherein said rectangular area for said P+ diffusion has sides of equal length to achieve the largest perimeter/area ratio for the largest current/capacitance ratio.

18. The circuit of claim 1, wherein the capacitance of said first I/O diode is less than 200 femtoF (femtoF=$10^{-15}$ Farad).

19. The circuit of claim 1, wherein a plurality of said first I/O diodes are arranged in a two-dimensional array.

20. The circuit of claim 1, wherein the anode of said second I/O diode is coupled to said second power supply, and the cathode of said second I/O diode is coupled to said I/O pad, said second I/O diode arranged as an N+ diffusion/P-substrate diode thusly:
where the cathode and the anode of said second I/O diode correspond to said N+ diffusion and said P-substrate, respectively;
where said N+ diffusion of said second I/O diode is arranged in a rectangular shape, the area of said rectangular shape determined by the number of contacts needed to pass a target current;
where said N+ diffusion further comprises an array of said contacts;
where a P-substrate tap of width S surrounds said N+ diffusion on all four sides; and
where contacts for each of said I/O pads further surround on all four sides said P-substrate tap, said contacts arranged on each side in one or more rows.

21. The circuit of claim 20, wherein a dimension S is set to a minimum to produce the lowest parasitic resistance in said P-substrate taps.

22. The circuit of claim 20, wherein said rectangular area for said N+ diffusion has sides of equal length to achieve the largest perimeter/area ratio for the largest current/capacitance ratio.

23. The circuit of claim 20, wherein the capacitance of said second I/O diode is less than 200 femtoF (femtoF=$10^{-15}$ Farad).

24. The circuit of claim 20, wherein a plurality of said second I/O diodes are arranged in a two-dimensional array.

25. A radio frequency (RF) electrostatic discharge (ESD) protection circuit for integrated circuits (IC) with a plurality of power supplies, comprising:
on a substrate, a dual-mode shunt system providing a low impedance path for ESD, said dual-mode shunt system further comprising
a pair of power supply rails consisting of a first and a second power supply rail;
a power supply in communication with said first and said second power supply rail;
a transient-type power shunt circuit in communication with said first and said second power supply rail, said power shunt circuit comprising timer and driver circuits, said power shunt circuit providing a low impedance path for an ESD between said first and said second power supply rail, said power shunt circuit designed to turn on when the voltage ramp on said first power supply rail is faster than a RC time-constant, intrinsic to said power shunt circuit, and larger than the threshold voltage (Vt) of a PMOS transistor;
a first and a second I/O diode formed in-between said first and said second power supply rail, the junction of said first and said second I/O diode coupled to an I/O pad, said first and said second I/O diode providing a conductive path for said ESD, where the cathode of said first I/O diode is coupled to said first power supply, and the anode of said first I/O diode is coupled to said I/O pad, said first I/O diode arranged as a P+ diffusion/N-well diode thusly:
where the anode and the cathode of said first I/O diode correspond to said P+ diffusion and said N-well, respectively;
where said P+ diffusion of said first I/O diode is arranged in a rectangular shape, the area of said rectangular shape determined by the number of contacts needed to pass a target current;

where said P+ diffusion further comprises an array of said contacts;

where an N-well tap surrounds said P+ diffusion on all four sides at a distance S;

where contacts of said N-well tap are arranged on each side of said N-well tap in one or more rows; and a plurality of said dual-mode shunt systems, each supplied by its own power supply operable at any supply voltage, said plurality of said dual-mode shunt systems all coupled together via said second power supply rail, said plurality of said dual-mode shunt systems capable of operating at any voltage of said power supplies, said first power supplies isolated from each other.

26. The circuit of claim 25, wherein said plurality of said dual-mode shunt systems is coupled together via said second power supply rails, each of said second power supply rails coupled to another second power supply rail by means of a set of complementary polarity diodes, said complementary polarity diodes isolating said plurality of second power supply rails from each other, to limit power supply noise cross talk.

27. The circuit of claim 26, wherein the voltage between any of said plurality of second power supplies does not differ by more than one diode drop.

28. The circuit of claim 16, wherein each pair of said power supply rails is provided with one of said power shunt circuits.

29. The circuit of claim 25, wherein said complementary polarity diodes are P+/N-well diodes made in an N-well/P-substrate process.

30. The circuit of claim 29, wherein said complementary polarity diodes are N+/P-substrate diodes when said second power supply rail is coupled to said substrate of said IC.

31. The circuit of claim 25, wherein additional I/O pads are coupled via additional first and second I/O diodes to said first and said second power supply rail.

32. The circuit of claim 25, wherein said power shunt circuit comprises said timer circuit in communication with said driver circuit, said timer and driver circuits utilizing metal oxide semiconductor (MOS) switching devices coupled between said first and said second power supply rail.

33. The circuit of claim 25, wherein the anode of said second I/O diode is coupled to said second power supply, and the cathode of said second I/O diode is coupled to said I/O pad, said second I/O diode arranged as an N+ diffusion/P-substrate diode thusly:

where the cathode and the anode of said second I/O diode correspond to said N+ diffusion and said P-substrate, respectively;

where said N+ diffusion of said second I/O diode is arranged in a rectangular shape, the area of said rectangular shape determined by the number of contacts needed to pass a target current;

where said N+ diffusion further comprises an array of said contacts;

where a P-substrate tap of width S surrounds said N+ diffusion on all four sides; and where contacts for each of said I/O pads further surround on all four sides said P-substrate tap, said contacts arranged on each side in one or more rows.

* * * * *